United States Patent
Pokharna

(10) Patent No.: US 7,308,931 B2
(45) Date of Patent: Dec. 18, 2007

(54) HEAT PIPE REMOTE HEAT EXCHANGER (RHE) WITH GRAPHITE BLOCK

(75) Inventor: Himanshu Pokharna, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 105 days.

(21) Appl. No.: 11/002,523

(22) Filed: Dec. 1, 2004

(65) Prior Publication Data

US 2006/0113064 A1    Jun. 1, 2006

(51) Int. Cl.
*F28D 15/00* (2006.01)
*H05K 7/20* (2006.01)

(52) U.S. Cl. .................... 165/104.21; 165/104.33; 165/185

(58) Field of Classification Search ........ 165/80.3, 165/104.21, 104.33, 168, 185; 361/700, 361/702, 704, 712–713; 257/720
See application file for complete search history.

(56) References Cited

U.S. PATENT DOCUMENTS

| | | | | |
|---|---|---|---|---|
| 5,771,967 A * | 6/1998 | Hyman | ...... | 165/274 |
| 6,065,529 A * | 5/2000 | Antoniuk et al. | ...... | 165/46 |
| 6,075,701 A * | 6/2000 | Ali et al. | ...... | 361/704 |
| 6,466,441 B1 * | 10/2002 | Suzuki | ...... | 361/695 |
| 6,810,944 B2 * | 11/2004 | Wiacek et al. | ...... | 165/41 |
| 6,968,890 B1 * | 11/2005 | Ghantiwala | ...... | 165/104.21 |
| 2005/0180113 A1 * | 8/2005 | Shirakami et al. | ...... | 361/704 |
| 2006/0086493 A1 * | 4/2006 | Fujiwara et al. | ...... | 165/185 |

* cited by examiner

*Primary Examiner*—Tho Duong
(74) *Attorney, Agent, or Firm*—Schwabe, Williamson & Wyatt, P.C.

(57) ABSTRACT

A cooling apparatus may include an attach block manufactured using at least partially a graphite material. The attach block may be coupled to two heat pipes. The graphite material may be positioned in between the two heat pipes and in a direction that enables high heat conductivity and low thermal resistance.

8 Claims, 8 Drawing Sheets

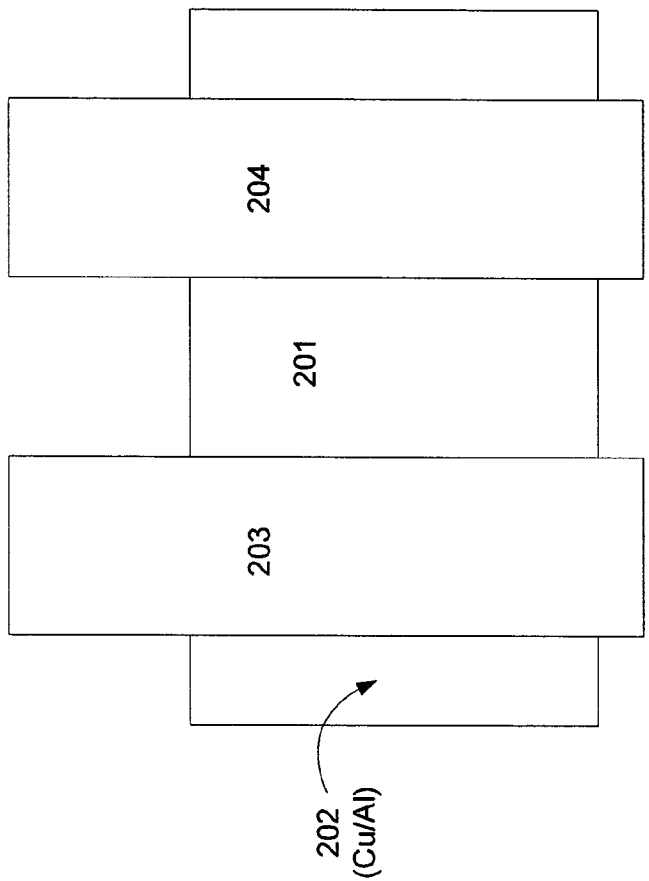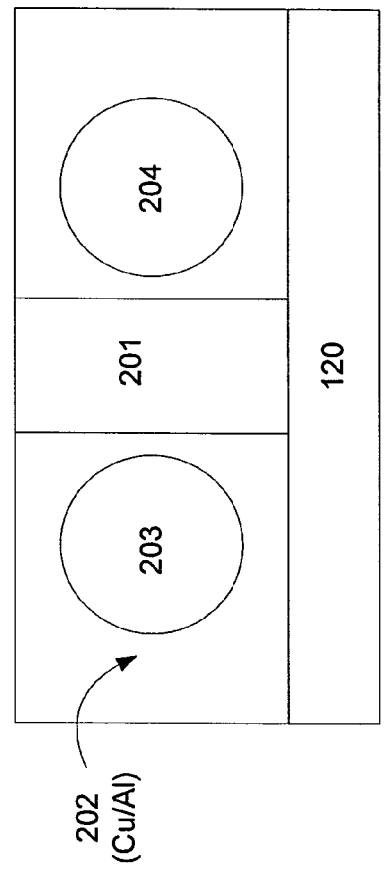

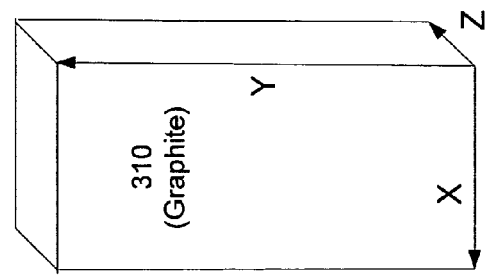
FIG. 3C (Graphite)
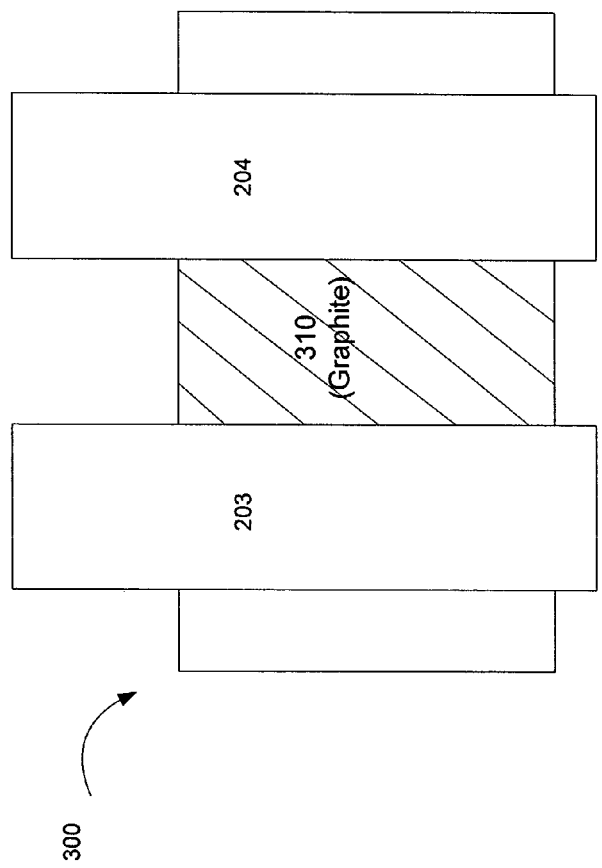
FIG. 3A (Top View)
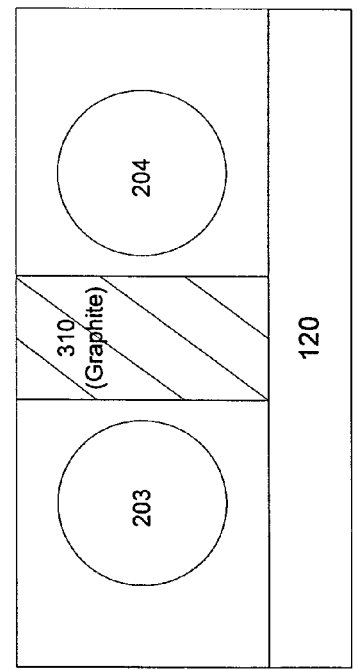
FIG. 3B (Cross Section)

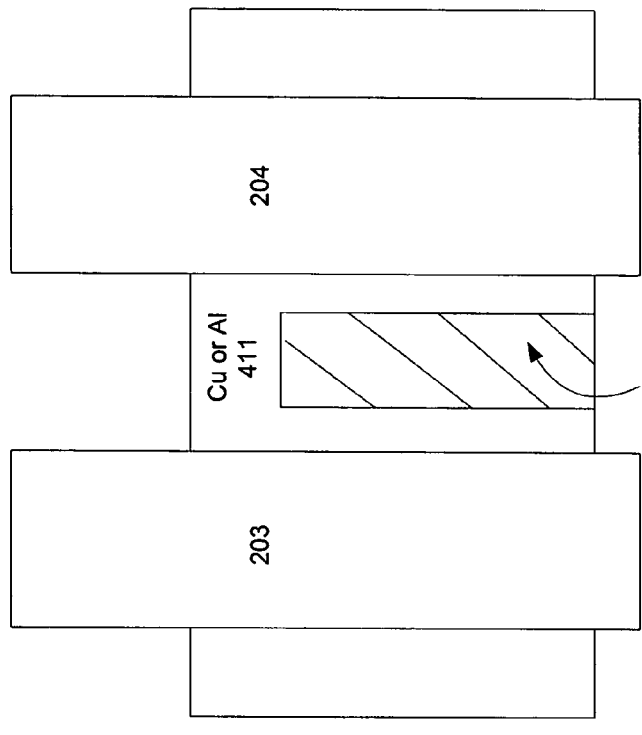
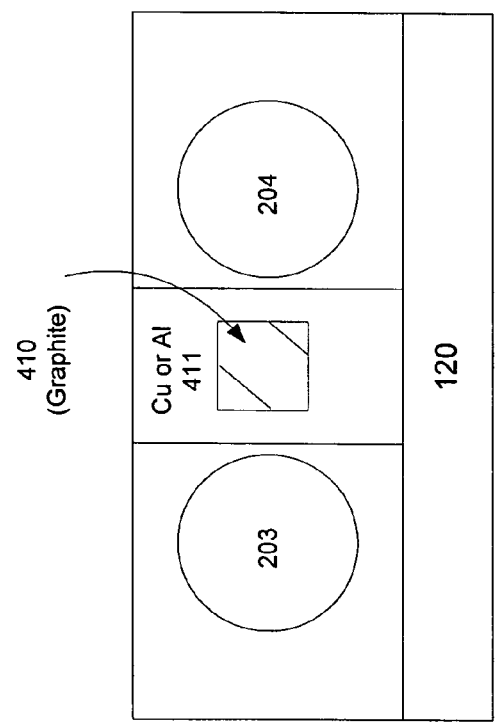

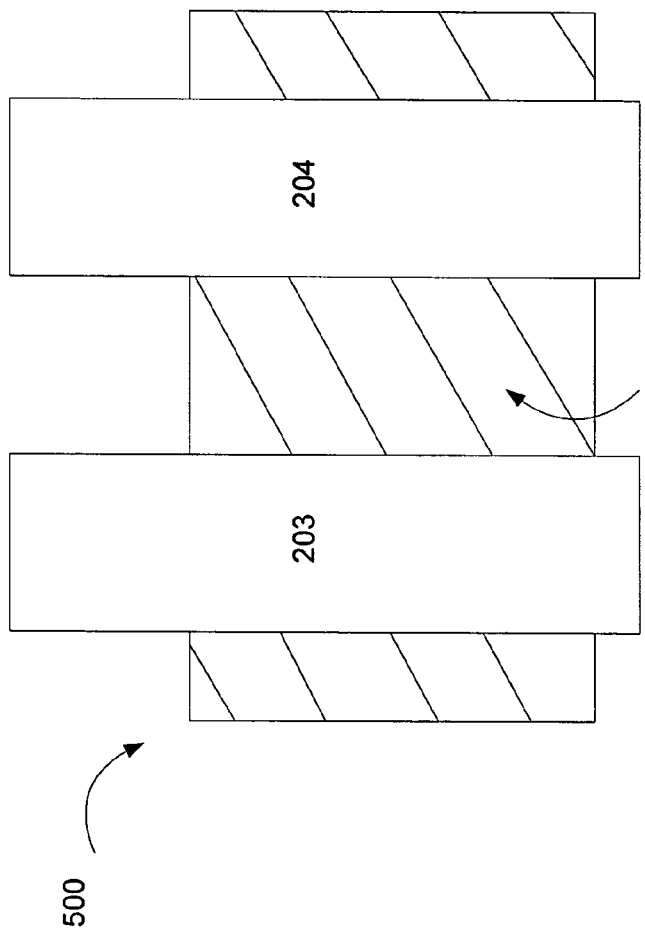
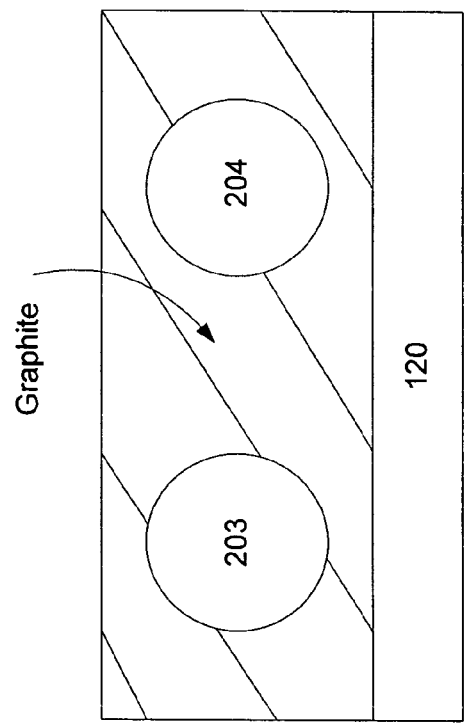
FIG. 5A (Top View)
FIG. 5B (Cross Section)

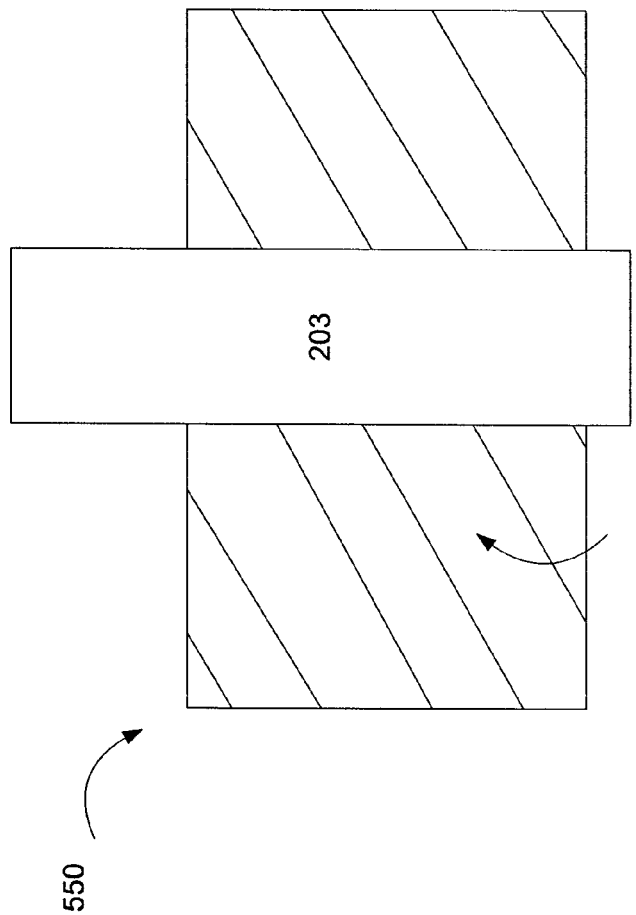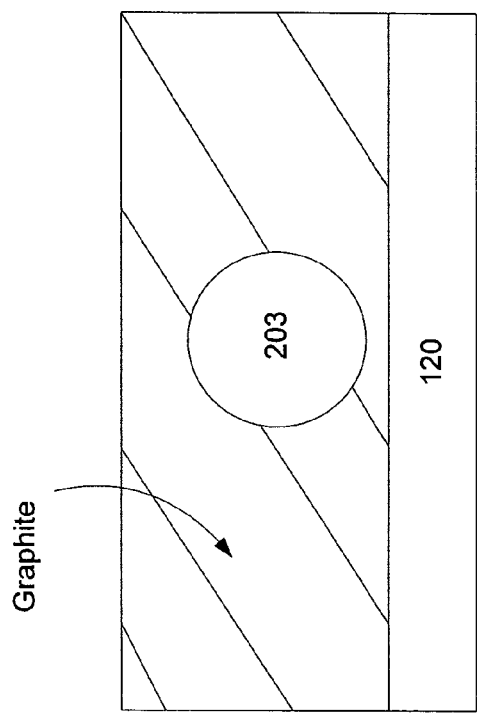

HEAT PIPE REMOTE HEAT EXCHANGER (RHE) WITH GRAPHITE BLOCK

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever.

1. Field of the Invention

The present invention generally relates to the field of cooling computer systems. More particularly, an embodiment of the present invention relates to cooling electronic components in the computer systems using heat pipes.

2. Background

Portable computer systems such as laptop or notebook computer systems are quickly gaining popularity because of their lightweight, increase in performance and decrease in cost. As more functions are integrated into these computer systems, heat becomes an important issue that needs to be addressed. One technique for thermal management includes using heat pipes. A heat pipe is essentially a passive heat transfer device which in its simplest configuration is a closed, evacuated cylindrical aluminum or copper vessel with internal walls lined with a capillary structure or wick that is saturated with a working fluid. Since the heat pipe is evacuated and then charged with the working fluid prior to being sealed, the internal pressure is set by the vapor pressure of the fluid. As heat enters the heat pipe at an evaporator end of the heat pipe, the heat causes the working fluid to vaporize. The vaporized fluid creates a pressure gradient, which forces the vapor to flow along the pipe to a cooler section (a condenser end of the heat pipe) where it condenses giving up its latent heat of vaporization. There are on-going efforts to improve the efficiency of heat pipe cooling system.

BRIEF DESCRIPTION OF THE DRAWINGS

The invention is illustrated by way of example and not limitation in the figures of the accompanying drawings, in which like references indicate similar or identical elements, and in which:

FIGS. 2B and 2C illustrate a top view and a cross-section view respectively of an attach block with the two heat pipes, in accordance with one embodiment FIGS. 3A and 3B illustrate a top view and a cross-section view respectively of an attach block having a graphite section, in accordance with one embodiment.

FIG. 3C illustrates an example of a graphite section, in accordance with one embodiment.

FIGS. 4A and 4B illustrate a top view and a cross-section view respectively of an attach block having a bridge area that is partially manufactured using graphite, in accordance with one embodiment.

FIGS. 5A and 5B illustrate an example of graphite attach block connected to two heat pipes, in accordance with one embodiment.

FIGS. 5C and 5D illustrate an example of graphite attach block connected to one heat pipe, in accordance with one embodiment.

DETAILED DESCRIPTION

For one embodiment, a cooling system that includes heat pipes and a remote heat exchanger (RHE) is disclosed. The heat pipes are coupled to an attach block. The attach block may include a graphite section. The graphite section may help reduce resistance associated with the cooling system.

In the following detailed description of the present invention numerous specific details are set forth in order to provide a thorough understanding of the present invention. However, it will be apparent to one skilled in the art that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
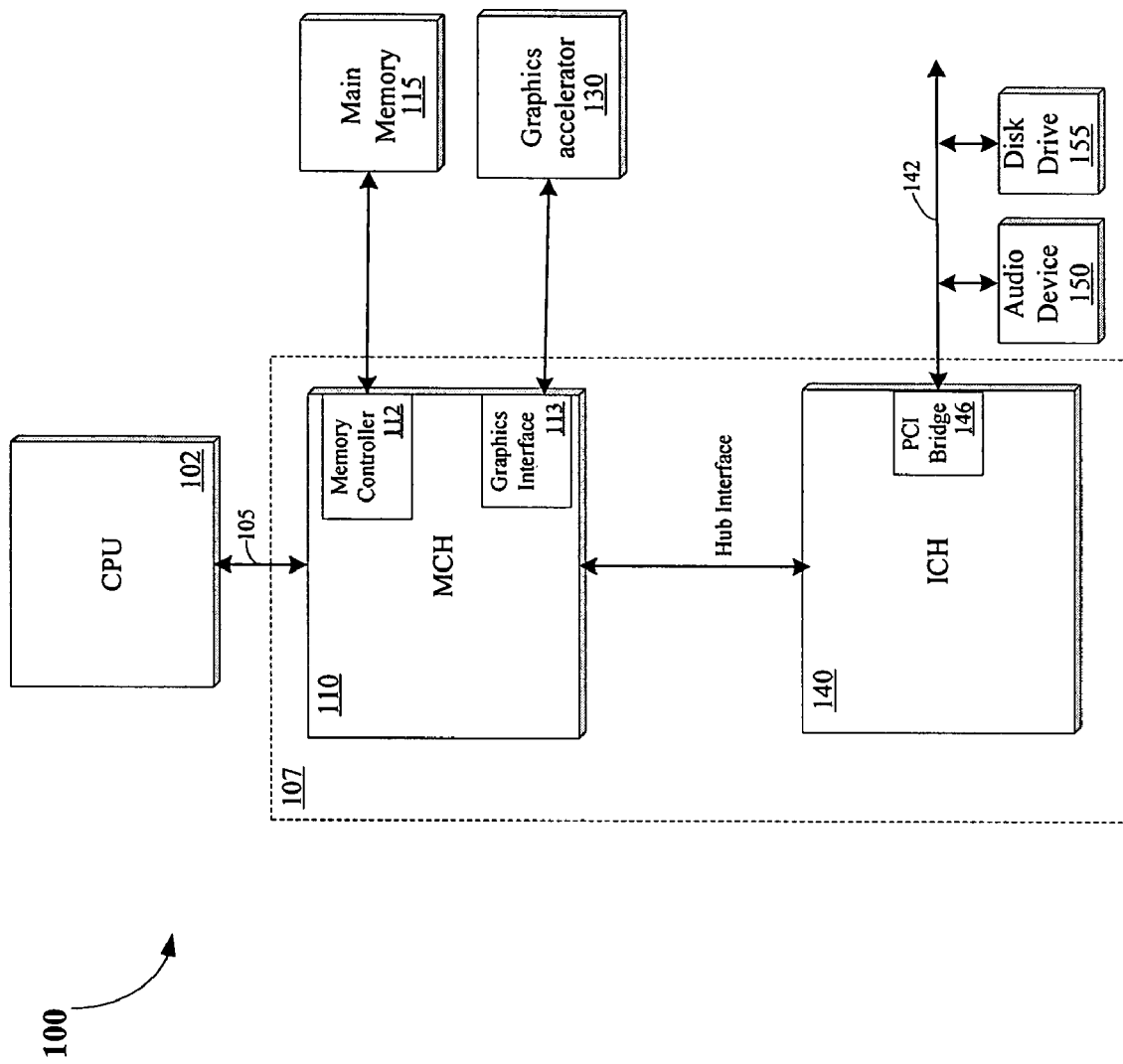
FIG. 1 illustrates an exemplary block diagram of a computer system which may be utilized to implement embodiments of the present invention.

FIG. 1 illustrates an exemplary block diagram of a computer system 100 which may be utilized to implement embodiments of the present invention. Although not shown, the computer system 100 is envisioned to receive electrical power from a direct current (DC) source (e.g., a battery) and/or from an alternating current (AC) source (e.g., by connecting to an electrical outlet). The computer system 100 includes a central processing unit (CPU) or processor 102 coupled to a bus 105. For one embodiment, the processor 102 may be a processor in the Pentium® family of processors including, for example, Pentium® IV processors, Intel's XScale processor, Intel's Pentium M Processors, etc. available from Intel Corporation of Santa Clara, Calif. Alternatively, other processors or other heat generating devices from other manufacturers may also be used.

The computer system 100 may also include chipset 107 coupled to the bus 105. The chipset 107 may include a memory control hub (MCH) 110. The MCH 110 may include a memory controller 112 that is coupled to a main memory 115. The main memory 115 may store data and sequences of instructions that are executed by the processor 102 or any other device included in the system 100. For one embodiment, the main memory 115 may include one or more of dynamic random access memory (DRAM), read-only memory (RAM), etc.

The MCH 110 may also include a graphics interface 113 coupled to a graphics accelerator 130. The graphics interface 113 may be coupled to the graphics accelerator 130 via an accelerated graphics port (AGP) that operates according to an AGP Specification Revision 2.0 interface developed by the Intel Corporation of Santa Clara, Calif. A display (not shown) may be coupled to the graphics interface 113. The MCH 110 may be coupled to an input/output control hub (ICH) 140 via a hub interface. The ICH 140 provides an interface to input/output (I/O) devices within the computer system 100. The ICH 140 may be coupled to a Peripheral Component Interconnect (PCI) bus adhering to a Specification Revision 2.1 bus developed by the PCI Special Interest Group of Portland, Oreg. Thus, the ICH 140 may include a PCI bridge 146 that provides an interface to a PCI bus 142. The PCI bridge 146 may provide a data path between the CPU 102 and peripheral devices such as, for example, an audio device 150 and a disk drive 155. Although not shown, other devices may also be coupled to the PCI bus 142 and the ICH 140.

Heat Pipe Cooling System

Figure 2A:
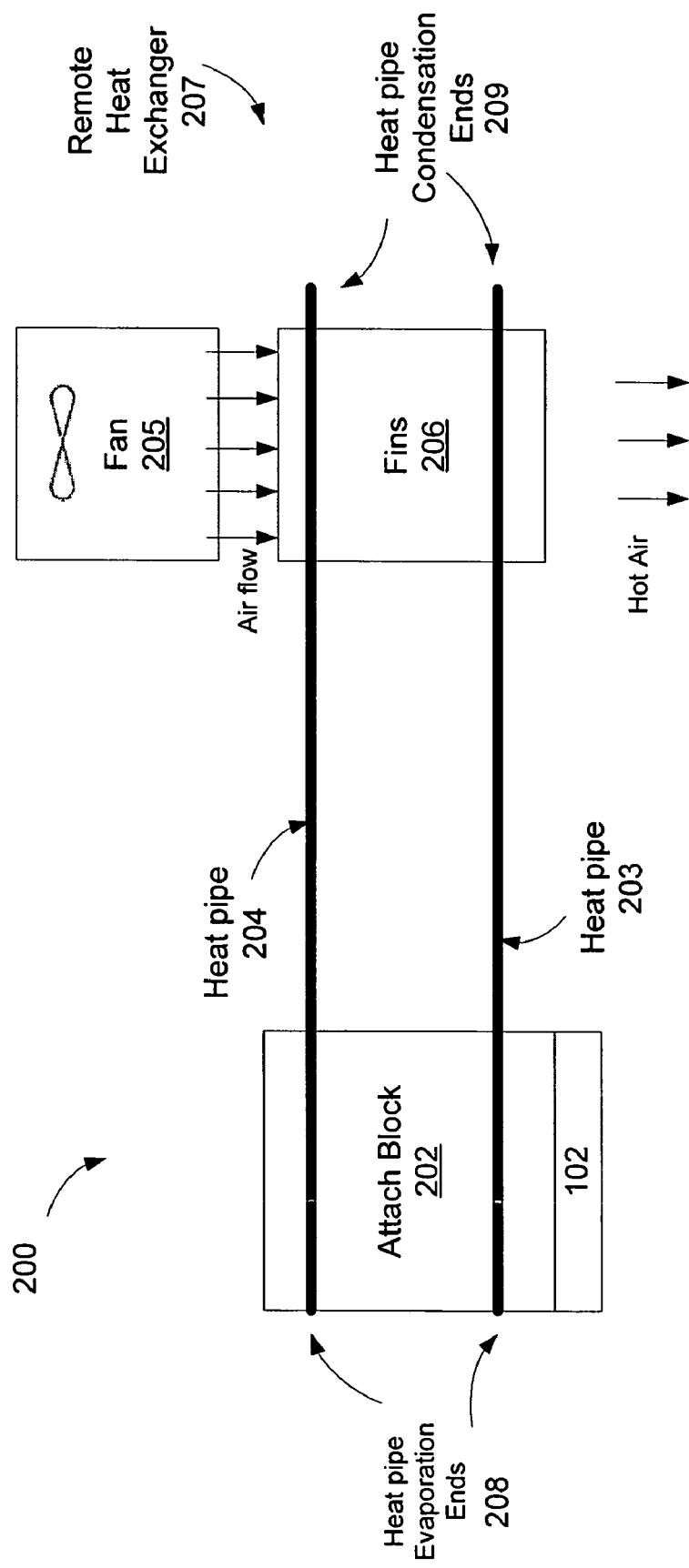
FIG. 2A illustrates an exemplary block diagram of a cooling system using heat pipes, in accordance with one embodiment.

FIG. 2A is a block diagram example of a heat pipe cooling system, in accordance with one embodiment. Cooling system 200 may include an attach block 202. The attach block 202 may be coupled to a heat generating device 102 such as, for example, the processor 102, the chipset 107, or any other devices in the system 100. The attach block 202 may also be coupled with two heat pipes 203 and 204. The heat pipes 203 and 204 may include evaporation ends 208 and condensation ends 209. Operation of a heat pipe is known to one skilled in the art. FIGS. 2B and 2C illustrate a top view and a cross-section view respectively of the attach block 202 with the two heat pipes 203 and 204, in accordance with one embodiment. The attach block 202 may typically be manufactured using copper (Cu) or aluminum (Al). The two heat pipes 203 and 204 and the attach block 202 may almost be centered on the heat generating device 102. The two heat pipes 203-204 may be separated by a bridge area 201. For example, the separation may be between 2 to 3 millimeters. The bridge area 201 may also be Cu or Al and is usually positioned right on top of the heat generating device 102. Referring to FIG. 2A, a remote heat exchanger (RHE) 207 may be coupled to the condensation ends 209 of the heat pipes 203 and 204. The RHE 207 may include fan 205 and fins 206 to help removing heat from the heat generating device 102. Although the heat pipes shown in the drawings have a circular cross-section, they may be flattened so they can be accommodates within a block that has thickness less than the diameter of the individual heat pipes.

One of the resistances encountered in a cooling system such as, for example, the cooling system 200 is the evaporation resistance in the heat pipes 203-204. The evaporation resistance may have several contributors, including, for example, conduction resistance through the attach block 202, resistance through the epoxy/other binding material between heat pipes 203-204 and the attach block 202, and the evaporation resistance of the heat pipes 203-204, etc. Among these, the evaporation resistance of the heat pipes 203-204 may be the largest. In addition, because the bottom of the heat pipes 203-204 offers the shortest path to the heat generating device 102, the evaporation resistance may differ significantly between the hotter bottom section and the cooler top section of the heat pipes 203-204.

Attach Block Using Graphite Material

FIGS. 3A and 3B illustrate a top view and a cross-section view respectively of an attach block having a graphite section, in accordance with one embodiment. For one embodiment, the bridge area 201 may be manufactured entirely out of graphite, referred to as a graphite section 310. Using graphite in the bridge area may be advantageous because graphite has higher conductivity than copper and hence it can spread the heat evenly around the heat pipe circumference, thus reducing the evaporator resistance. Furthermore, graphite is lighter than the typically used attach block materials (e.g., Cu, Al). Thermal conductivity of graphite may be dependent upon its purity, crystalline structure and manufacturing process used. For example annealed phyolytic graphite may have conductivity as high as 1300-1500 W/m-K at room temperature.

FIG. 3C illustrates an example of a graphite section, in accordance with one embodiment. As illustrated, the graphite section 310 may include three directions X, Y, and Z relative to the heat generating device 120. For one embodiment, the application of the graphite section 310 may be limited to some of the directions. For example, the graphite section 310 may produce higher conductivity in two directions (e.g., Y and Z directions) and lower conductivity in another direction (e.g., X direction). The conductivity of the less desirable direction may be approximately 10 W/m-K. Using the graphite section in the directions that have high conductivity may allow the top section of the heat pipe to participate more in the boiling of the fluid and reduce the difference in the temperature with the bottom section, thus providing more boiling area and reducing the evaporator resistance.

For another embodiment, the configuration of the graphite section 310 may include being thin (e.g., Z direction) in comparison to its length and width (e.g., Y and X directions, respectively). This configuration of the graphite section 310 may help spreading heat in the Z direction as well as along the length of the heat pipes 203-204 thus providing more area for boiling and evaporation.

FIGS. 4A and 4B illustrate a top view and a cross-section view respectively of an attach block having a bridge area that is partially manufactured using graphite, in accordance with one embodiment. Using graphite in the attach block may help reducing evaporation resistance but may also add more cost to the manufacturing of the attach block as compared to using the traditional materials. For one embodiment, instead of the bridge area being entirely graphite as illustrated in FIGS. 3A and 3B, a small graphite section is inserted into the bridge area. In this example, the bridge area includes a graphite section 410 and a Cu or Al section 411. This may help keep the cost of the attach block low.

For one embodiment, the evaporation resistance may be further reduced by having the attach block manufactured entirely out of graphite. This is illustrated as attach block 500 in FIGS. 5A and 5B. This may be possible when manufacturing cost using the graphite material is less of a factor than its weight and/or performance. An application of the attach block manufactured entirely out of graphite may not be limited to using two or more heat pipes. FIGS. 5C and 5D illustrate another example of graphite attach block connected to one heat pipe, in accordance with one embodiment.

One advantage of reducing the overall resistance associated with the attach block and the heat pipe is the potential of increasing the thermal design power (TDP) of a heat generating device, especially when the heat generating device is employed in a portable computer. Increasing the TDP of a heat generating device may enable the device to continue to operate at a high performance level for a longer time.

Figure 6:
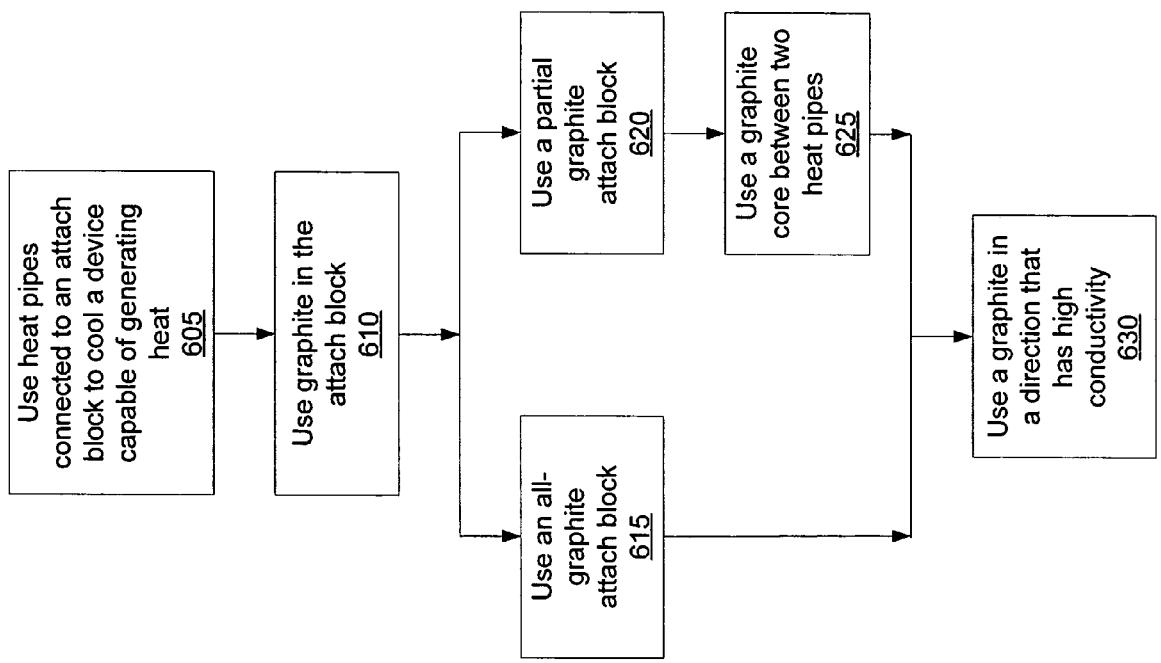
FIG. 6 is an example of a flow diagram describing a process of using an attach block that includes graphite material, in accordance with one embodiment.

FIG. 6 is an example of a flow diagram describing a process of cooling a heat generating device using an attach block having graphite material, in accordance with one embodiment. At block 605, a cooling system using one or more heat pipes is used to cool a device capable of generating heat. The heat pipes are attached to an attach block. Graphite may be used in the attach block, as shown in block 610. One option is to use the graphite entirely in the attach block, as shown in block 615. Another option is to use graphite partially in the attach block, as shown in block 620. When using graphite partially in the attach block, the graphite section may be placed in between the heat pipes within the bridge area, as shown in block 625. With both options, the graphite may need to be used in a direction that has high conductivity, as shown in block 630.

From the above description and drawings, it will be understood by those of ordinary skill in the art that the particular embodiments shown and described are for purposes of illustration only and are not intended to limit the scope of the invention. Those of ordinary skill in the art will recognize that the invention may be embodied in other specific forms without departing from its spirit or essential characteristics. References to details of particular embodiments are not intended to limit the scope of the claims.

What is claimed is:

1. The system comprising:
    a device capable of generating heat;
    a first heat pipe coupled to the device via an attach block, wherein the attach block includes at least a section manufactured using graphite and positioned in a direction enabling high conductivity of heat, wherein the first heat pipe is further coupled to a remote heat exchanger (RHE), and wherein the RHE is not in direct contact with the attach block; and
    a second heat pipe coupled to the device via the attach block, wherein the graphite section is positioned between the first heat pipe and the second heat pipe, wherein the attach block further includes a section manufactured using copper (Cu) or aluminum (Al).

2. The system of claim 1, wherein the graphite section is thin in thickness comparing to its length and width.

3. The aparatus comprising:
    a first heat pipe and a second heat pipe coupled to an attach block, wherein the first heat pipe is separated from the second heat pipe by a graphite section; and
    a remote heat exchanger (RHE) coupled to the first heat pipe and the second heat pipe, wherein the RHE is not in direct contact with the attach block, wherein, except for the graphite section, the attach block is manufactured using copper (Cu) or aluminum (Al).

4. The apparatus of claim 3, wherein the attach block is coupled to a heat generating device, and wherein the graphite section is positioned in a direction that enables high conductivity of heat.

5. The apparatus of claim 4, wherein position of the graphite section is relative to the heat generating device.

6. The apparatus of claim 5, wherein thickness of the graphite section is small comparing to its length and width.

7. The method comprising:
    inserting a graphite sectin in between the first heat pipe and the second heat pipe, and into an attach block coupleing to a first heat pipe and a second heat pipe to reduce resistance in coooling a heat generating device coupled to the attach block, the graphite secion positioned in a direction relative to the heat generating device to enable high heat conductivity, wherein the first heat pipe and the second heat pipe are coupled to a remote heat exchanter (RHE) not in direct contact with the attach block; and
    except for the graphite section, using copper or aluminum as a material entirely for the attach block.

8. The method of claim 7, wherein the graphite section includes a thickness, a width and a length, and wherein the thickness is small comparing to the width and the length.

* * * * *

UNITED STATES PATENT AND TRADEMARK OFFICE
CERTIFICATE OF CORRECTION

PATENT NO. : 7,308,931 B2
APPLICATION NO. : 11/002523
DATED : December 18, 2007
INVENTOR(S) : Himanshu Pokharna It is certified that error appears in the above-identified patent and that said Letters Patent is hereby corrected as shown below:

Column 5
Line 29, "The aparatus..." should read --The apparatus...--.

Column 6
Line 16, "...a graphic sectin..." should read --...a graphic section...--.

Column 6
Line 18, "...coupleing..." should read --...coupling...--.

Column 6
Line 24, "...heat exchanter..." should read --...heat exchanger...--.

Signed and Sealed this

Eighteenth Day of August, 2009

David J. Kappos
*Director of the United States Patent and Trademark Office*